(12) United States Patent
Lau et al.

(10) Patent No.: US 11,710,690 B2
(45) Date of Patent: Jul. 25, 2023

(54) PACKAGE STRUCTURE AND MANUFACTURING METHOD THEREOF

(71) Applicant: Unimicron Technology Corp., Taoyuan (TW)

(72) Inventors: John Hon-Shing Lau, Taoyuan (TW); Cheng-Ta Ko, Taipei (TW); Pu-Ju Lin, Hsinchu (TW); Kai-Ming Yang, Hsinchu County (TW); Chia-Yu Peng, Taoyuan (TW); Chi-Hai Kuo, Taoyuan (TW); Tzyy-Jang Tseng, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 120 days.

(21) Appl. No.: 17/233,551

(22) Filed: Apr. 19, 2021

(65) Prior Publication Data

US 2022/0336333 A1 Oct. 20, 2022

(51) Int. Cl.
*H01L 23/498* (2006.01)
*H01L 21/48* (2006.01)
*H01L 23/00* (2006.01)

(52) U.S. Cl.
CPC ...... *H01L 23/49816* (2013.01); *H01L 21/486* (2013.01); *H01L 21/4857* (2013.01);
(Continued)

(58) Field of Classification Search
CPC ........... H01L 23/49816; H01L 21/4857; H01L 21/486; H01L 23/49822; H01L 23/49838;
(Continued)

(56) References Cited

U.S. PATENT DOCUMENTS

| 6,032,355 A * | 3/2000 | Tseng | ............... H01L 23/3677 |
| | | | 257/E23.105 |
| 10,062,652 B2 * | 8/2018 | Lee | ..................... H01L 24/19 |

(Continued)

FOREIGN PATENT DOCUMENTS

| TW | 200703451 | 1/2007 |
| TW | I394500 | 4/2013 |

(Continued)

OTHER PUBLICATIONS

"Office Action of Taiwan Counterpart Application", dated Apr. 25, 2022, p. 1-p. 9.

*Primary Examiner* — Douglas W Owens
(74) *Attorney, Agent, or Firm* — JCIPRNET

(57) ABSTRACT

A package structure includes at least one first redistribution layer, at least one second redistribution layer, a chip pad, a solder ball pad, a chip, a solder ball, and a molding compound. The first redistribution layer includes a first dielectric layer and a first redistribution circuit that fills a first opening and a second opening of the first dielectric layer. The first dielectric layer is aligned with the first redistribution circuit. The second redistribution layer includes a second and a third dielectric layers and a second redistribution circuit. The third dielectric layer is aligned with the second redistribution circuit. The chip pad and the solder ball pad are electrically connected to the first and the second redistribution circuits respectively. The chip and the solder ball are disposed on the chip pad and the solder ball pad respectively. The molding compound at least covers the chip and the chip pad.

20 Claims, 19 Drawing Sheets

(52) U.S. Cl.
CPC .. *H01L 23/49822* (2013.01); *H01L 23/49838* (2013.01); *H01L 24/13* (2013.01); *H01L 24/16* (2013.01); *H01L 2224/13147* (2013.01); *H01L 2224/16235* (2013.01); *H01L 2224/16237* (2013.01); *H01L 2224/16238* (2013.01)

(58) Field of Classification Search
CPC .................. H01L 24/13; H01L 24/16; H01L 2224/13147; H01L 2224/16235; H01L 2224/16237; H01L 2224/16238
See application file for complete search history.

(56) References Cited

U.S. PATENT DOCUMENTS

| | | | |
|---|---|---|---|
| 2017/0133351 A1* | 5/2017 | Su | H01L 23/5389 |
| 2018/0233432 A1* | 8/2018 | Kim | H01L 23/3128 |
| 2019/0333837 A1* | 10/2019 | Kang | H01L 23/367 |
| 2020/0035591 A1* | 1/2020 | Hu | G01R 3/00 |
| 2020/0381405 A1* | 12/2020 | Patil | H01L 23/50 |
| 2022/0328387 A1* | 10/2022 | Lau | H01L 21/6835 |

FOREIGN PATENT DOCUMENTS

| | | |
|---|---|---|
| TW | 201843794 | 12/2018 |
| TW | I690045 | 4/2020 |

* cited by examiner

PACKAGE STRUCTURE AND MANUFACTURING METHOD THEREOF

BACKGROUND

Technical Field

The disclosure relates to a semiconductor structure and a manufacturing method thereof, and more particularly to a package structure and a manufacturing method thereof.

Description of Related Art

In recent years, high-performance computing (HPC) has gain increasing popularity and is widely used in advanced network and server applications, especially in artificial intelligence (AI) related products requiring high data rates, increased bandwidths, and decreased time delay. Among them, people's expectations and requirements for high-density (HD) package carriers used in package structures containing high-performance computing (HPC) grow. For example, the line width and line spacing of the metal layer are required to be between submicron and 10 microns, and the thickness of the dielectric layer of the redistribution layer is required to be between 1 micron and 5 microns. However, the current build-up package substrates fail to meet the above requirements.

SUMMARY

The disclosure provides a package structure and a manufacturing method thereof that may be used to solve the above technical problems.

The disclosure provides a package structure including at least one first redistribution layer, at least one second redistribution layer, a chip pad, a solder ball pad, a chip, a solder ball, and a molding compound. The first redistribution layer includes a first dielectric layer and a first redistribution circuit. The first dielectric layer includes a first opening and a second opening communicating with each other. A pore size of the second opening is greater than a pore size of the first opening, and the first redistribution circuit fills the first opening and the second opening. A first upper surface of the first dielectric layer is aligned with a first surface of the first redistribution circuit. The second redistribution layer is disposed on the first redistribution layer. The second redistribution layer includes a second dielectric layer, a third dielectric layer, and a second redistribution circuit. The second dielectric layer includes a third opening, and the second redistribution circuit is disposed on the second dielectric layer, extends into the third opening, and is electrically connected to the first redistribution layer. The third dielectric layer covers the second dielectric layer and the second redistribution circuit and fills the third opening. A second upper surface of the third dielectric layer is aligned with a second surface of the second redistribution circuit. The chip pad is disposed on a first lower surface of the first dielectric layer opposite to the first upper surface and is electrically connected to the first redistribution circuit. The solder ball pad is disposed on the second upper surface of the third dielectric layer and is electrically connected to the second redistribution circuit. The chip is disposed on the chip pad and is electrically connected to the chip pad. The solder ball is disposed on the solder ball pad and is electrically connected to the solder ball pad. The molding compound is disposed on the first lower surface of the first dielectric layer and at least covers the chip and the chip pad.

In one embodiment of the disclosure, a material of the first dielectric layer includes silicon dioxide.

In one embodiment of the disclosure, a material of the second dielectric layer includes a photosensitive dielectric material.

In one embodiment of the disclosure, the above first redistribution circuit has a submicron metal line width and line spacing.

In one embodiment of the disclosure, the above second redistribution circuit has a metal line width and line spacing greater than or equal to 1 micron and less than or equal to 10 microns.

In one embodiment of the disclosure, each of the first redistribution circuit and the second redistribution circuit includes a seed layer and a metal layer disposed on the seed layer.

In one embodiment of the disclosure, each of the chip pad and the solder ball pad includes a seed layer and a metal layer disposed on the seed layer.

In one embodiment of the disclosure, a thickness of the first redistribution layer is less than a thickness of the second redistribution layer.

In one embodiment of the disclosure, the package structure further includes a protective layer disposed on the second upper surface of the third dielectric layer. A third surface of the protective layer is aligned with a fourth surface of the solder ball pad.

In one embodiment of the disclosure, the package structure further includes a copper pillar and a solder material. The copper pillar is disposed on the chip, and the solder material is disposed on the copper pillar. The chip is electrically connected to the chip pad through the solder material on the copper pillar.

The disclosure further provides a manufacturing method of a package structure, and the method includes the following steps. At least one first redistribution layer is formed on a first carrier. The first redistribution layer includes a first dielectric layer and a first redistribution circuit. The first dielectric layer includes a first opening and a second opening communicating with each other. A pore size of the second opening is greater than a pore size of the first opening, and the first redistribution circuit fills the first opening and the second opening. A first upper surface of the first dielectric layer is aligned with a first surface of the first redistribution circuit. At least one second redistribution layer is formed on the first redistribution layer. The second redistribution layer includes a second dielectric layer, a third dielectric layer, and a second redistribution circuit. The second dielectric layer includes a third opening, and the second redistribution circuit is disposed on the second dielectric layer, extends into the third opening, and is electrically connected to the first redistribution layer. The third dielectric layer covers the second dielectric layer and the second redistribution circuit and fills the third opening. A second upper surface of the third dielectric layer is aligned with a second surface of the second redistribution circuit. A solder ball pad is formed on the second upper surface of the third dielectric layer, and the solder ball pad is electrically connected to the second redistribution circuit. A second carrier is provided on the solder ball pad, and the first carrier is removed to expose a first lower surface of the first dielectric layer opposite to the first upper surface. A chip pad is formed on the first lower surface of the first dielectric layer, and the chip pad is electrically connected to the first redistribution circuit. A chip is disposed on the chip pad and is electrically connected to the chip pad. A molding compound is formed on the first lower surface of the first dielectric layer. The molding compound at least covers the chip and the chip pad. The second carrier is removed to expose the solder ball pad. A solder ball is formed on the solder ball pad and is electrically connected to the solder ball pad.

In one embodiment of the disclosure, the step of forming the first redistribution layer on the first carrier includes the following steps. The first dielectric layer is formed on the first carrier through a plasma-enhanced chemical vapor deposition (PECVD) process. A reactive ion etching (RIE) process is performed on the first dielectric layer to form the first opening and the second opening communicating with each other. A seed material is formed on the first upper surface of the first dielectric layer, an inner wall of the first opening, and an inner wall of the second opening. A metal material is formed on the seed material. The metal material covers the seed material and fills the first opening and the second opening. A polishing process is performed to the metal material and the seed material to expose the first upper surface of the first dielectric layer and form a metal layer and a seed layer located in the first opening and the second opening. The metal layer and the seed layer define the first redistribution circuit.

In one embodiment of the disclosure, the step of forming the second redistribution layer on the first redistribution layer includes the following steps. The second dielectric layer is formed on the first redistribution layer. The second dielectric layer covers the first upper surface of the first dielectric layer and includes a third opening exposing part of a first surface of the first redistribution circuit. A seed material is formed on the second dielectric layer and an inner wall of the third opening. A patterned photoresist layer is formed on the seed material, and the patterned photoresist layer exposes part of the seed material. The patterned photoresist layer is treated as an electroplating mask to deposit a metal material on the seed material exposed by the patterned photoresist layer through electro-chemical deposition (ECD). The patterned photoresist layer and the seed material thereunder are removed to form a metal layer and a seed layer thereunder to define the second redistribution circuit. The third dielectric layer is formed on the second dielectric layer and covers the second redistribution circuit.

In one embodiment of the disclosure, the step of forming the solder ball pad on the second upper surface of the third dielectric layer includes the following steps. A fourth dielectric layer is formed on the second redistribution layer. The fourth dielectric layer covers the second upper surface of the third dielectric layer and includes a fourth opening exposing part of the second surface of the second redistribution circuit. A seed material is formed on the fourth dielectric layer and an inner wall of the fourth opening. A patterned photoresist layer is formed on the seed material, and the patterned photoresist layer exposes part of the seed material. The patterned photoresist layer is treated as an electroplating mask to electroplate a metal material on the seed material exposed by the patterned photoresist layer. The patterned photoresist layer and the seed material thereunder are removed to form a metal layer and a seed layer thereunder to define the solder ball pad.

In one embodiment of the disclosure, the manufacturing method of the package structure further includes the following step. A protective layer is formed on the fourth dielectric layer, and a third surface of the protective layer is aligned with a fourth surface of the solder ball pad.

In one embodiment of the disclosure, the step of forming the chip pad on the first lower surface of the first dielectric layer includes the following steps. An RIE process is performed on the first dielectric layer to form an opening exposing part of the first redistribution circuit. A seed material is formed on the first dielectric layer and an inner wall of the opening. A patterned photoresist layer is formed on the seed material, and the patterned photoresist layer exposes part of the seed material. The patterned photoresist layer is treated as an electroplating mask to electroplate a metal material on the seed material exposed by the patterned photoresist layer. The patterned photoresist layer and the seed material thereunder are removed to form a metal layer and a seed layer thereunder to define the chip pad.

In one embodiment of the disclosure, the manufacturing method of the package structure further includes the following steps. A copper pillar is formed on the chip before the chip is disposed on the chip pad. A solder material is formed on the copper pillar. The chip is electrically connected to the chip pad through the solder material on the copper pillar.

In one embodiment of the disclosure, a material of the first dielectric layer includes silicon dioxide, and a material of the second dielectric layer includes a photosensitive dielectric material.

In one embodiment of the disclosure, the first redistribution circuit has a submicron metal line width and line spacing.

In one embodiment of the disclosure, the second redistribution circuit has a metal line width and line spacing greater than or equal to 1 micron and less than or equal to 10 microns.

Based on the above, in the package structure and the manufacturing method thereof provided by the disclosure, the first redistribution layer and the second redistribution layer of completely different structure types are formed. In following, the chip is disposed and the package process is performed before the second carrier is removed and the solder ball is disposed. The first redistribution circuit of the first redistribution layer fills the first opening and the second opening of the first dielectric layer communicating with each other and having different pore sizes. The first upper surface of the first dielectric layer is aligned with the first surface of the first redistribution circuit. The second redistribution circuit of the second redistribution layer is disposed on the second dielectric layer, extends into the third opening of the second dielectric layer, and is electrically connected to the first redistribution layer. The third dielectric layer covers the second dielectric layer and the second redistribution circuit and fills the third opening, and the second upper surface of the third dielectric layer is aligned with the second surface of the second redistribution circuit. Compared with the manufacturing of existing build-up package substrates, the package structure of the disclosure may form two redistribution layers of different structure types, and in this way, people's expectations and requirements for high-density package structures are satisfied.

In order to make the aforementioned features and advantages of the disclosure comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
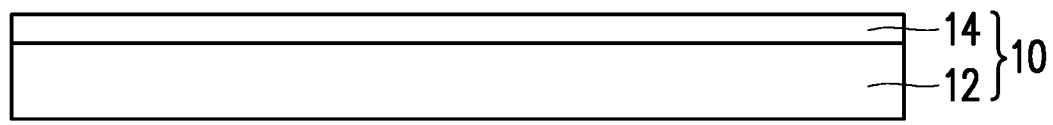
FIG. 1A to FIG. 1Z are schematic cross-sectional views of a manufacturing method of a package structure according to an embodiment of the disclosure.
Figure 1B:
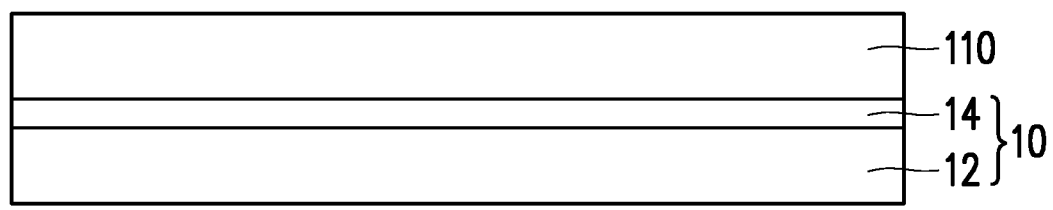
Figure 1C:
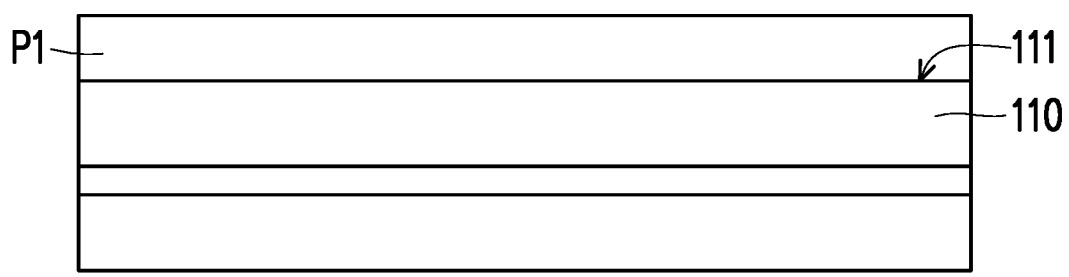
Figure 1D:
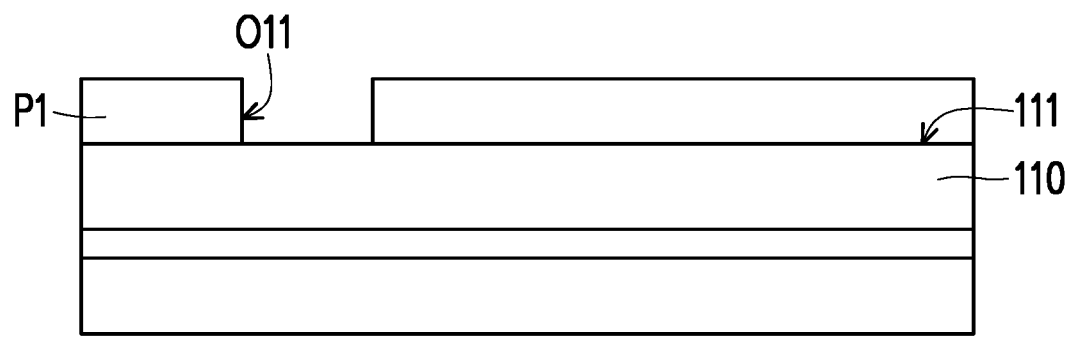
Figure 1E:
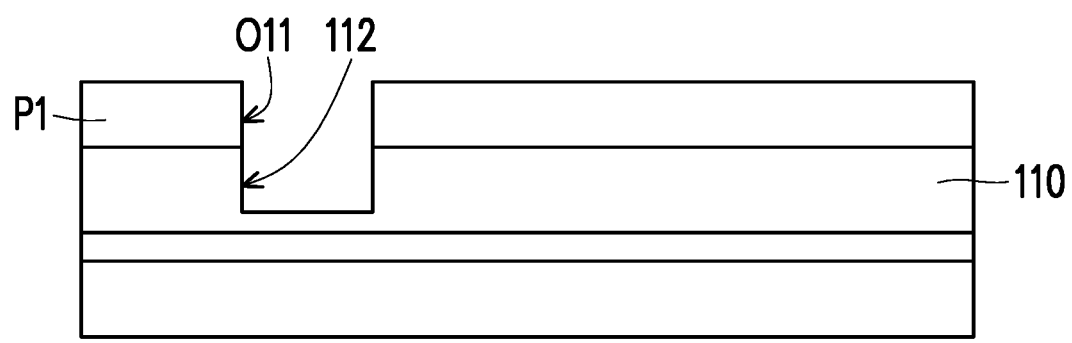
Figure 1F:
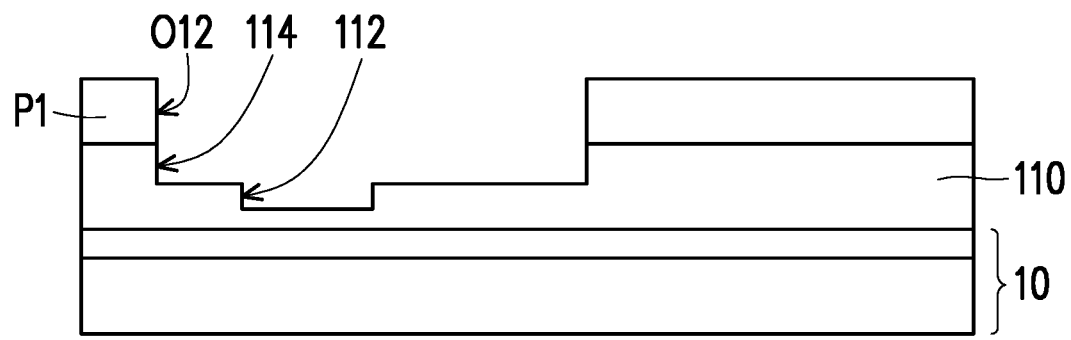
Figure 1G:
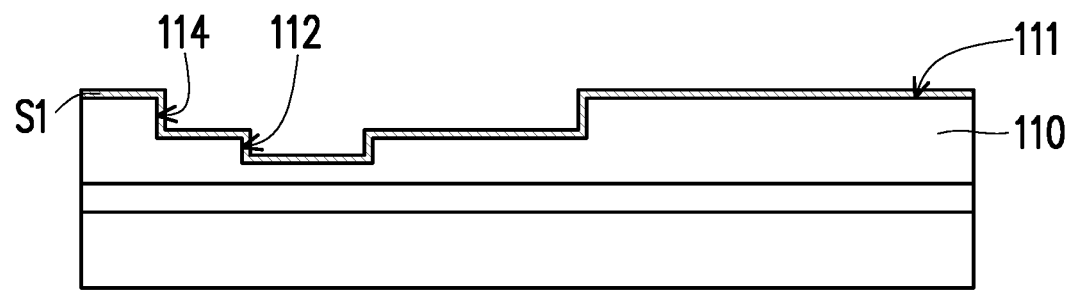
Figure 1H:
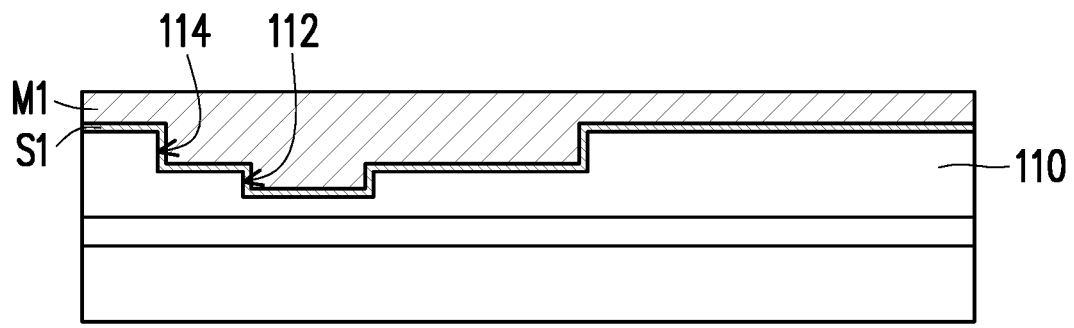
Figure 1I:
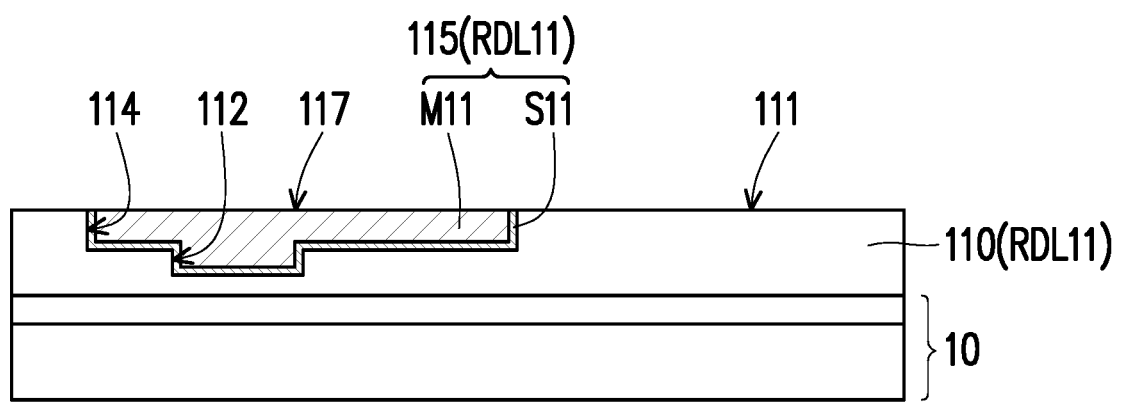
Figure 1J:
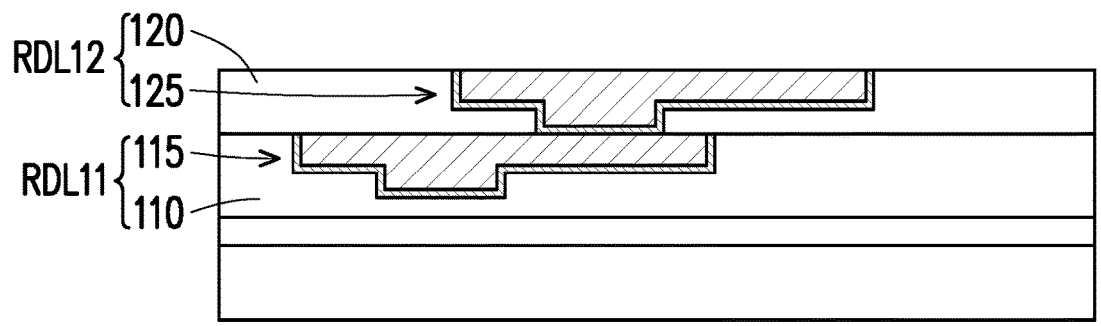
Figure 1K:
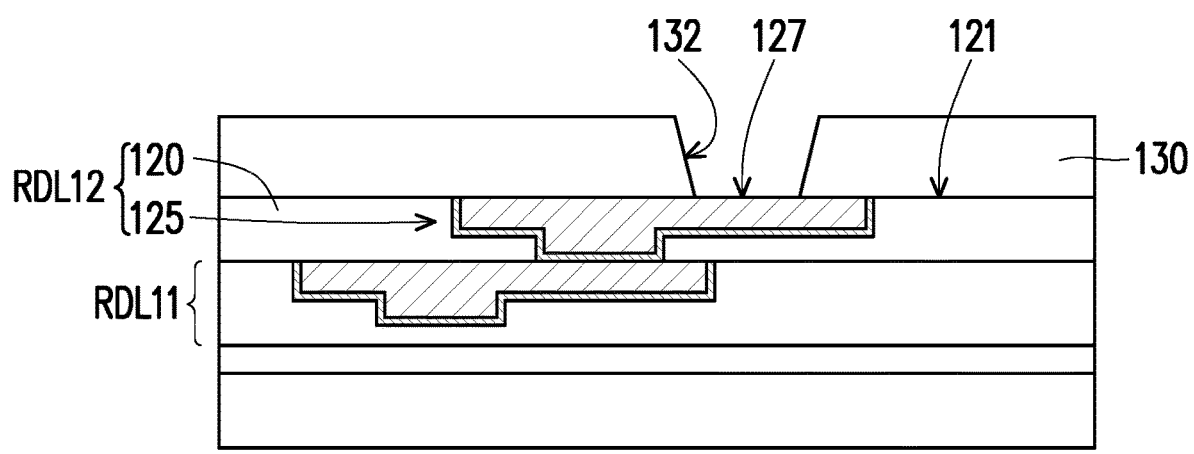
Figure 1L:
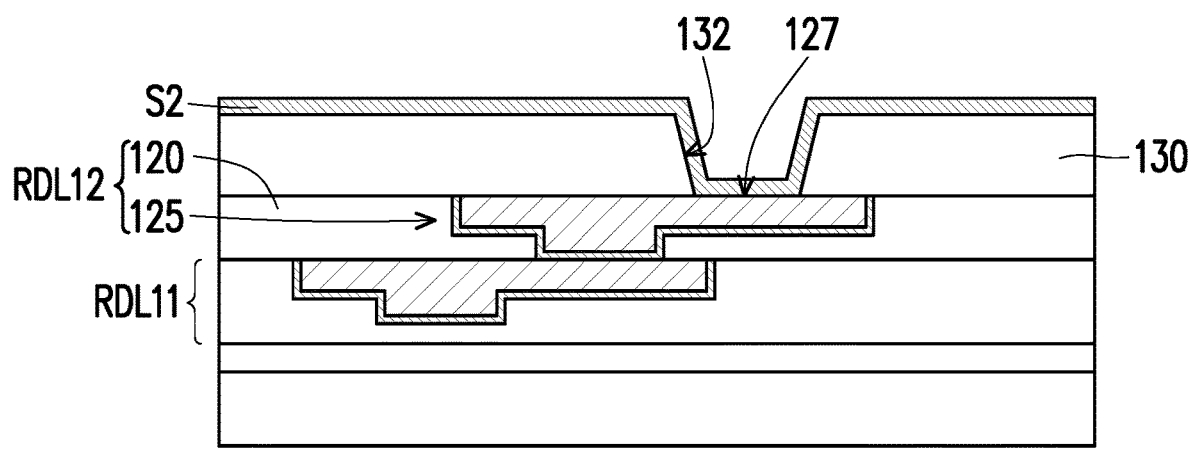
Figure 1M:
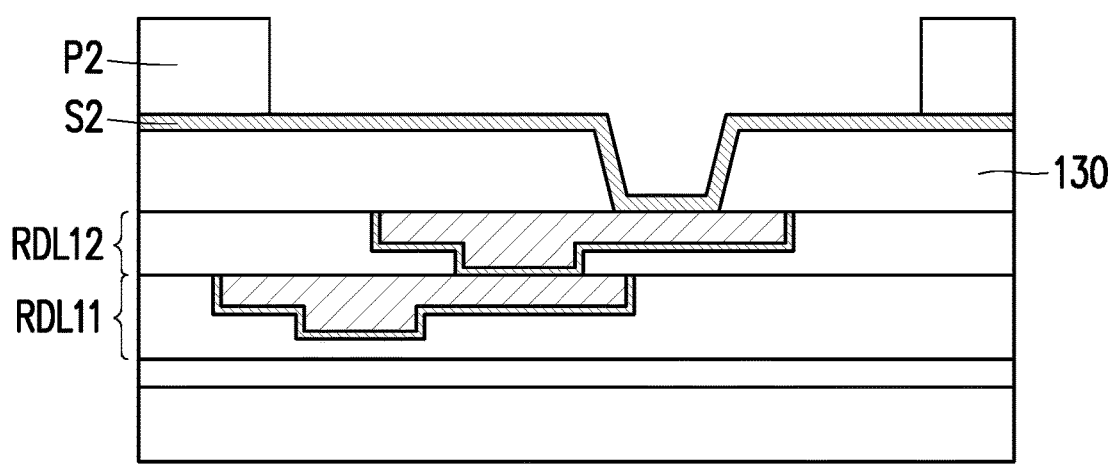
Figure 1N:
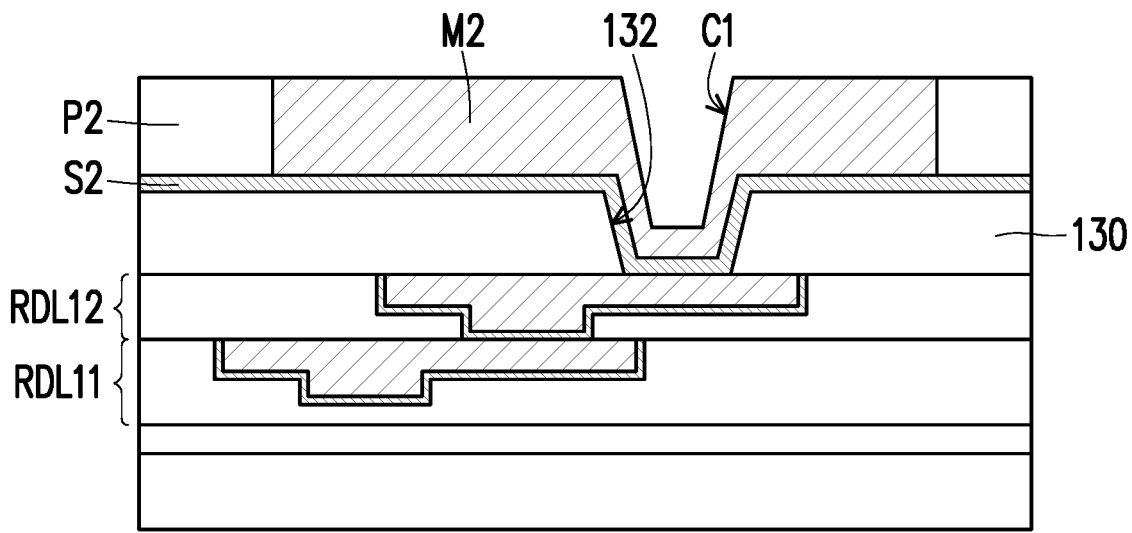
Figure 1O:
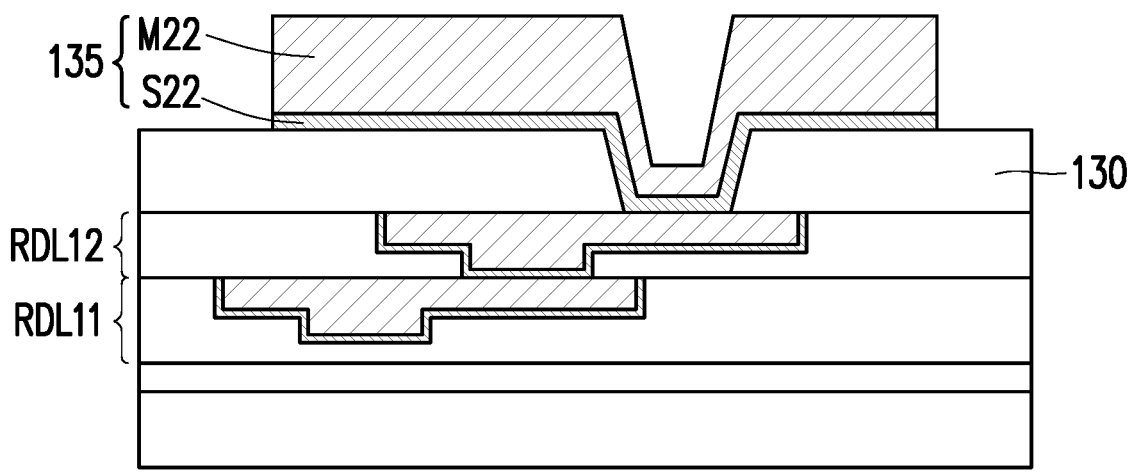
Figure 1P:
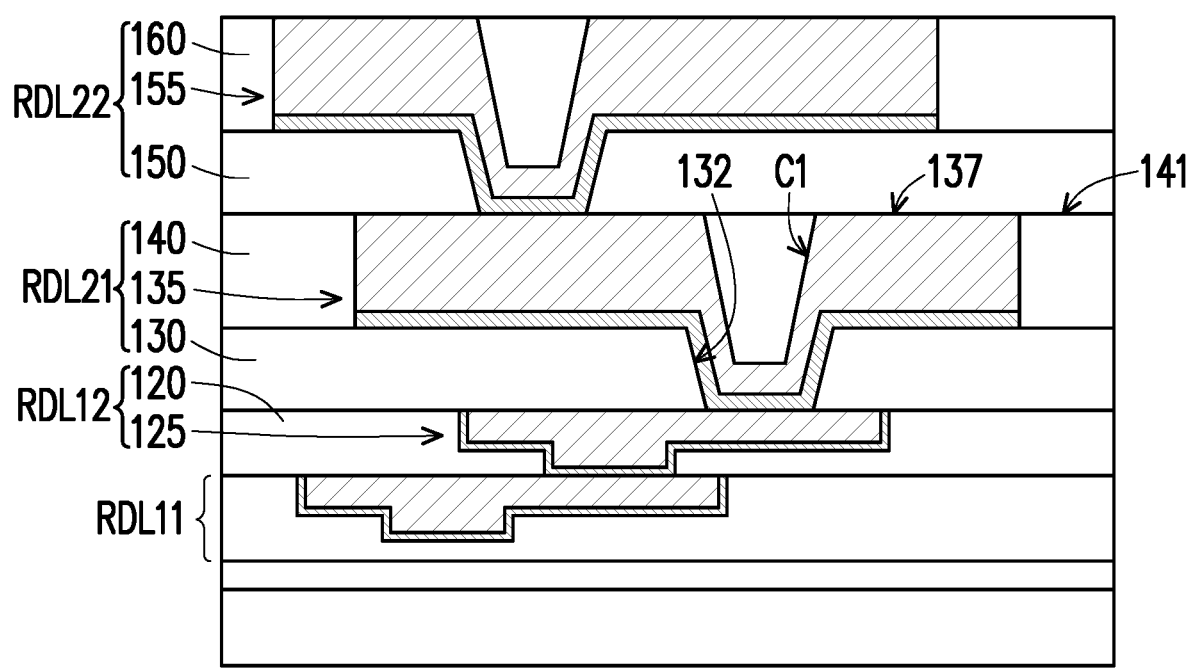
Figure 1Q:
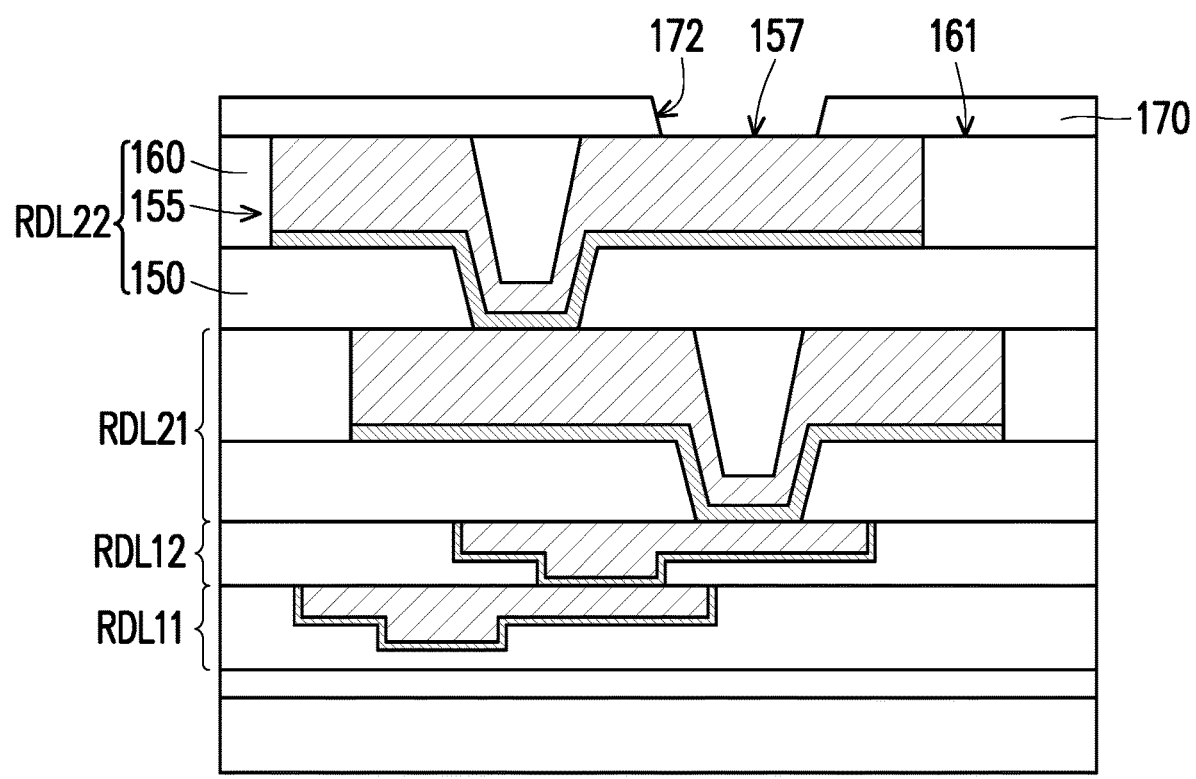
Figure 1R:
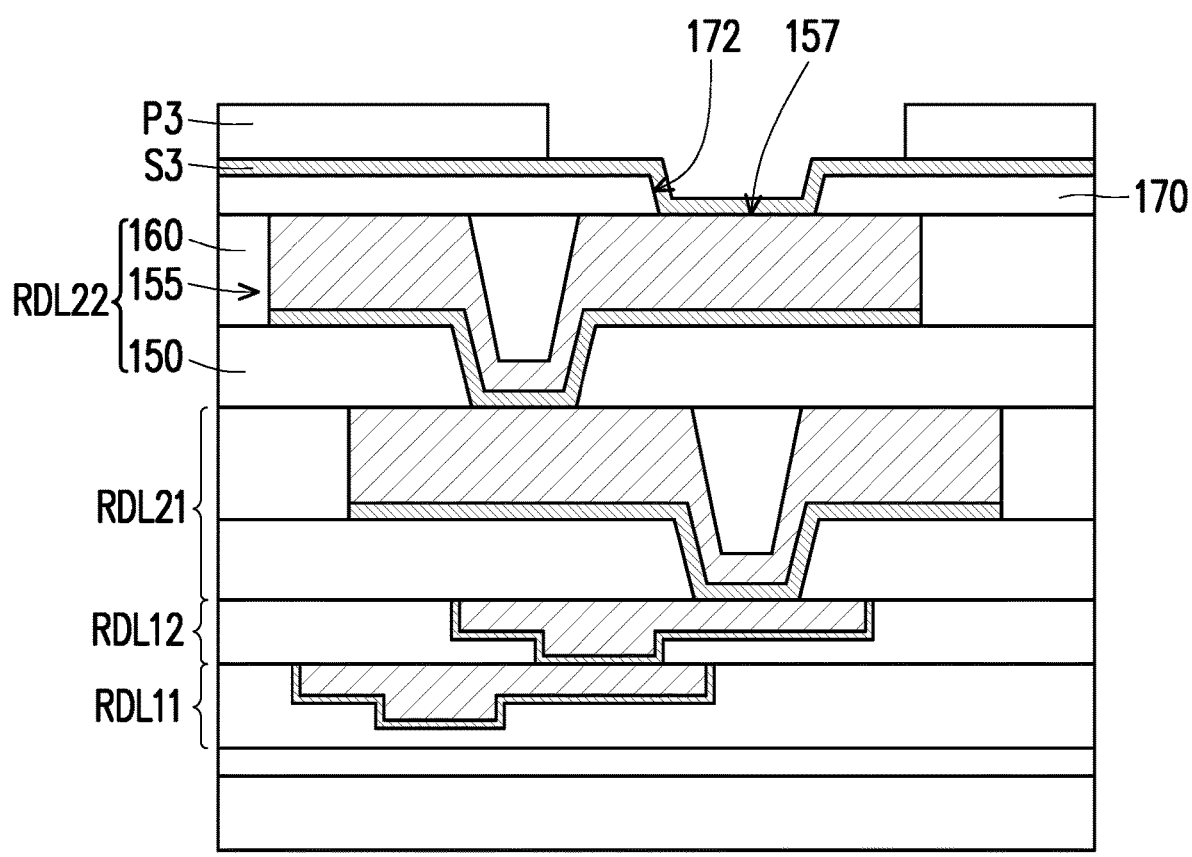
Figure 1S:
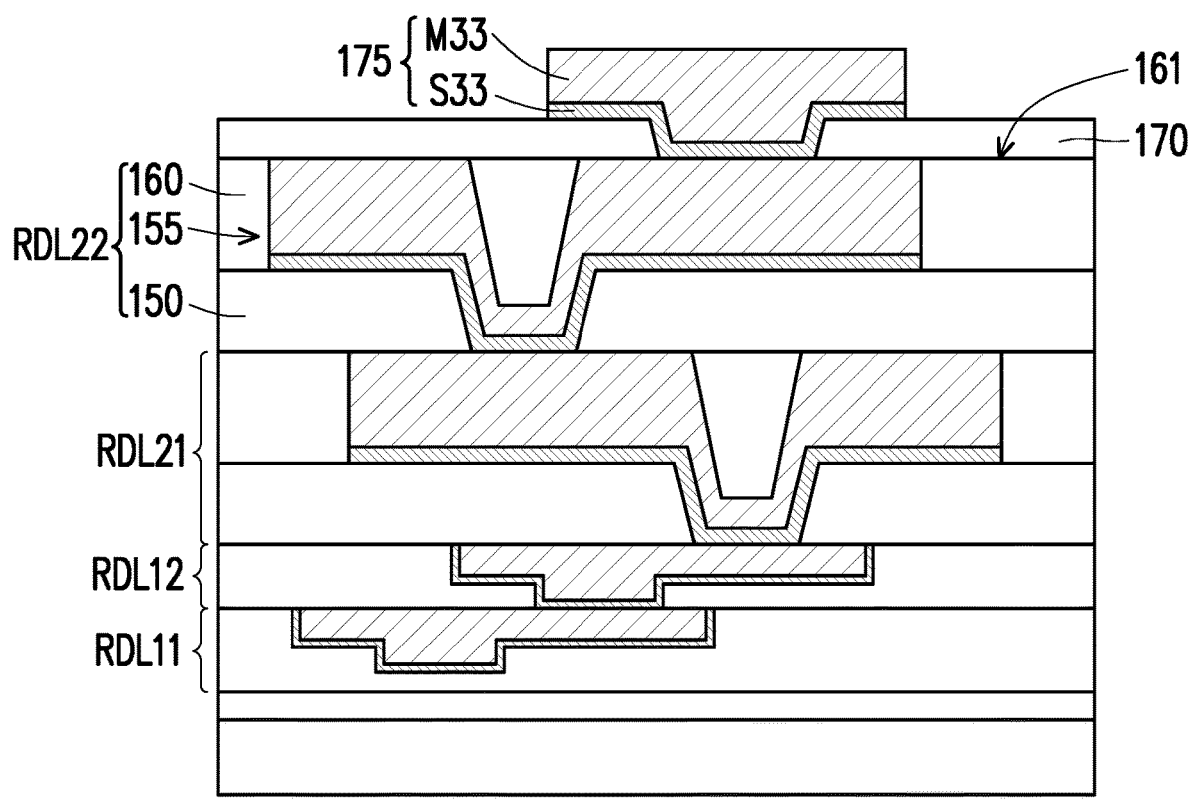
Figure 1T:
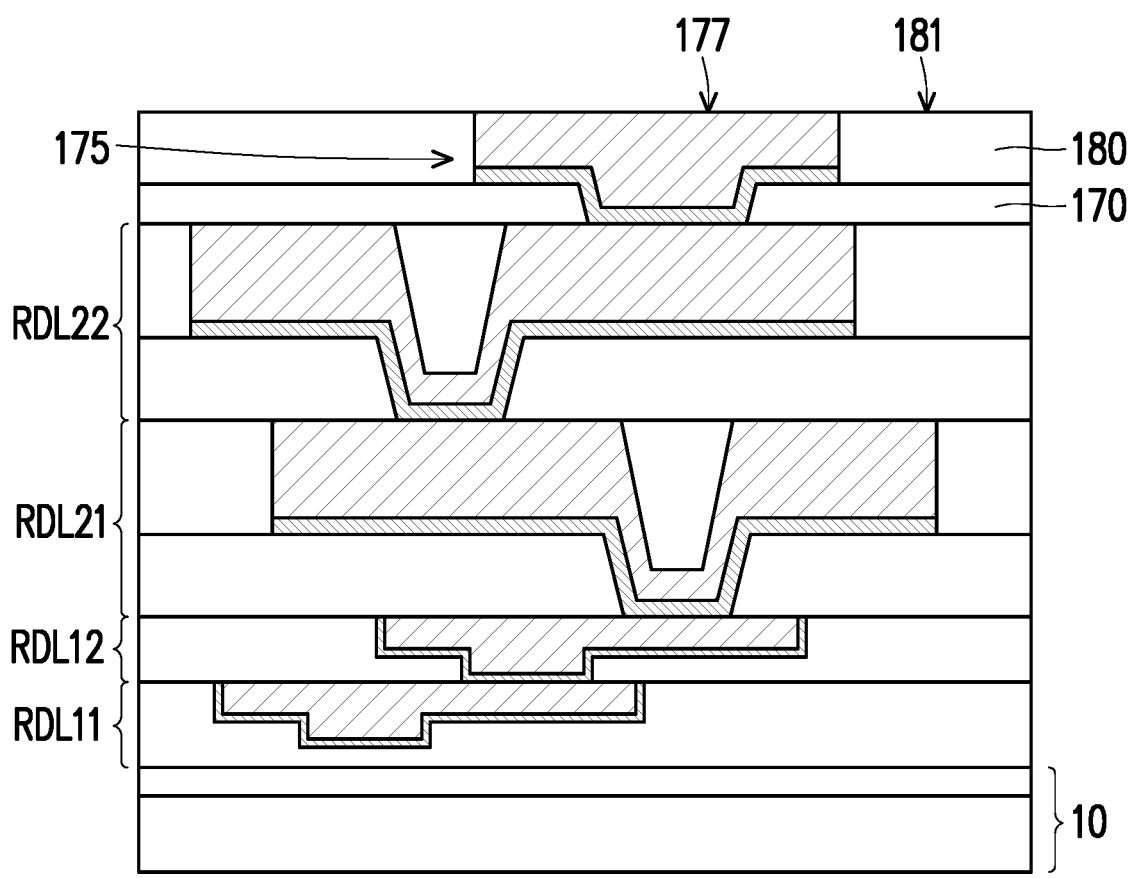
Figure 1U:
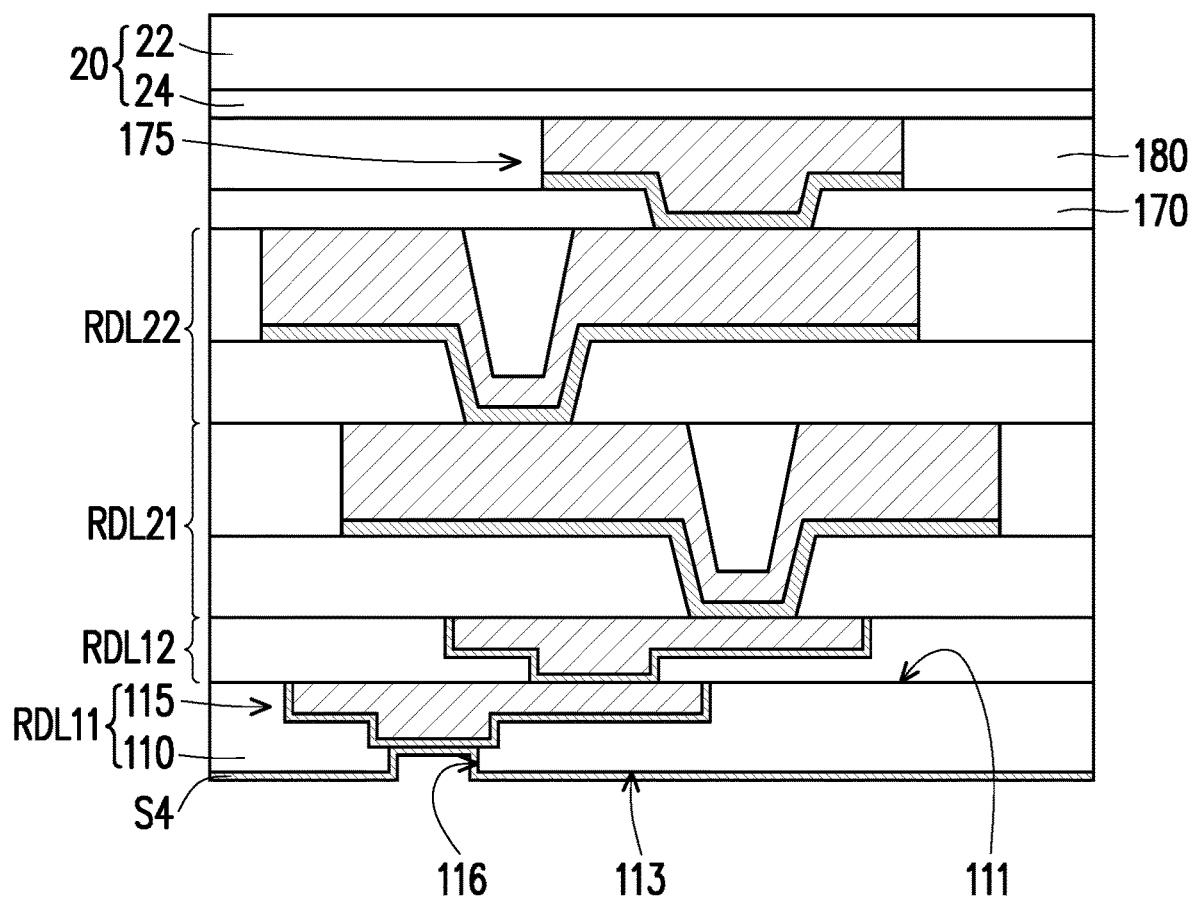
Figure 1V:
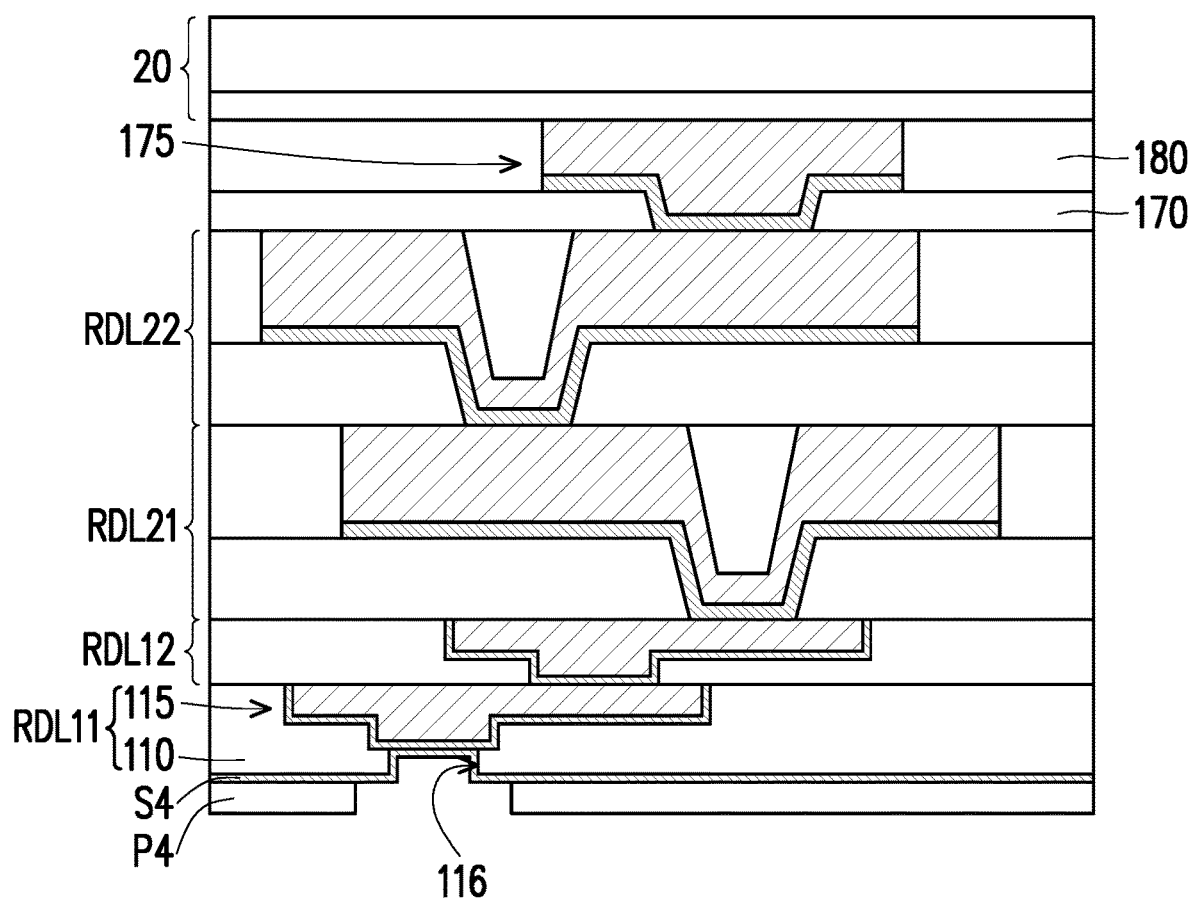
Figure 1W:
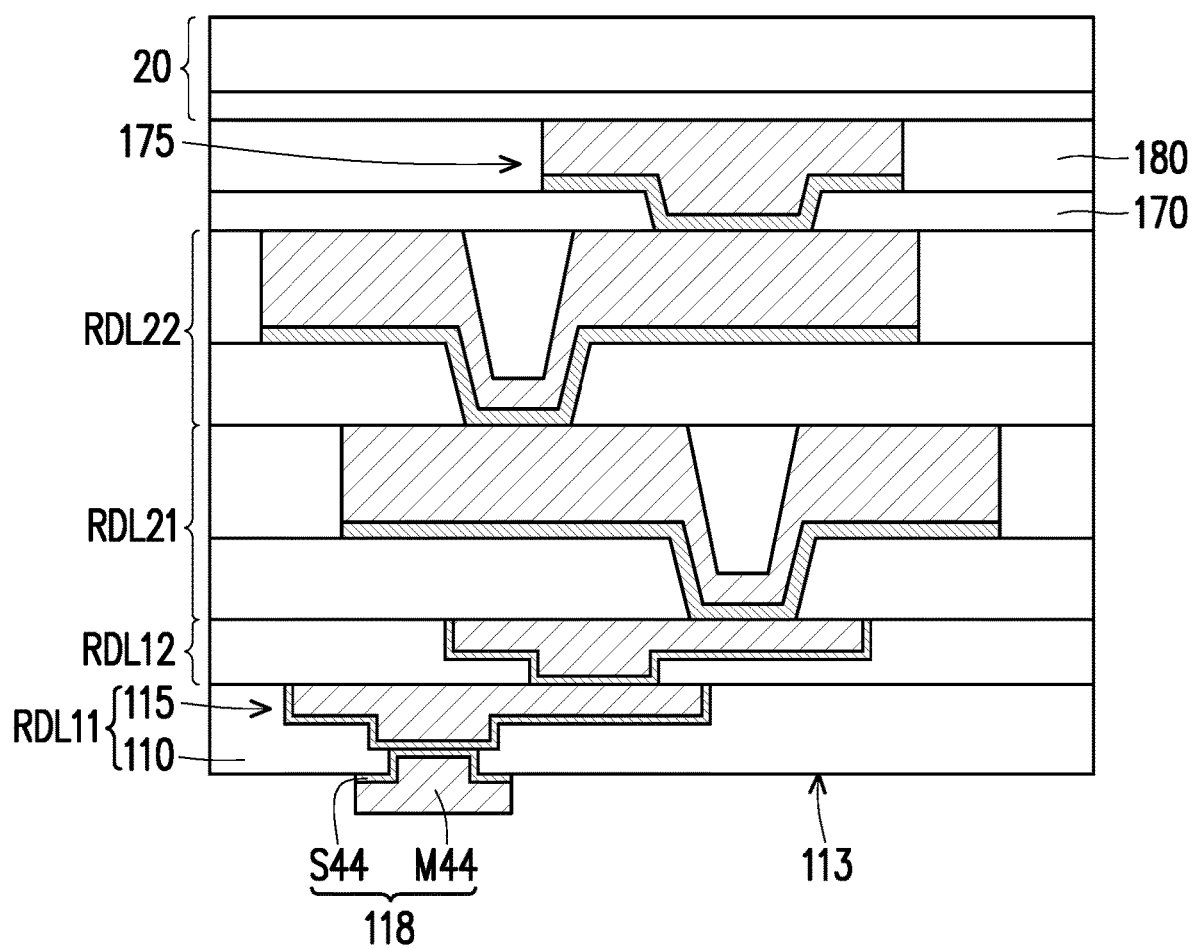
Figure 1X:
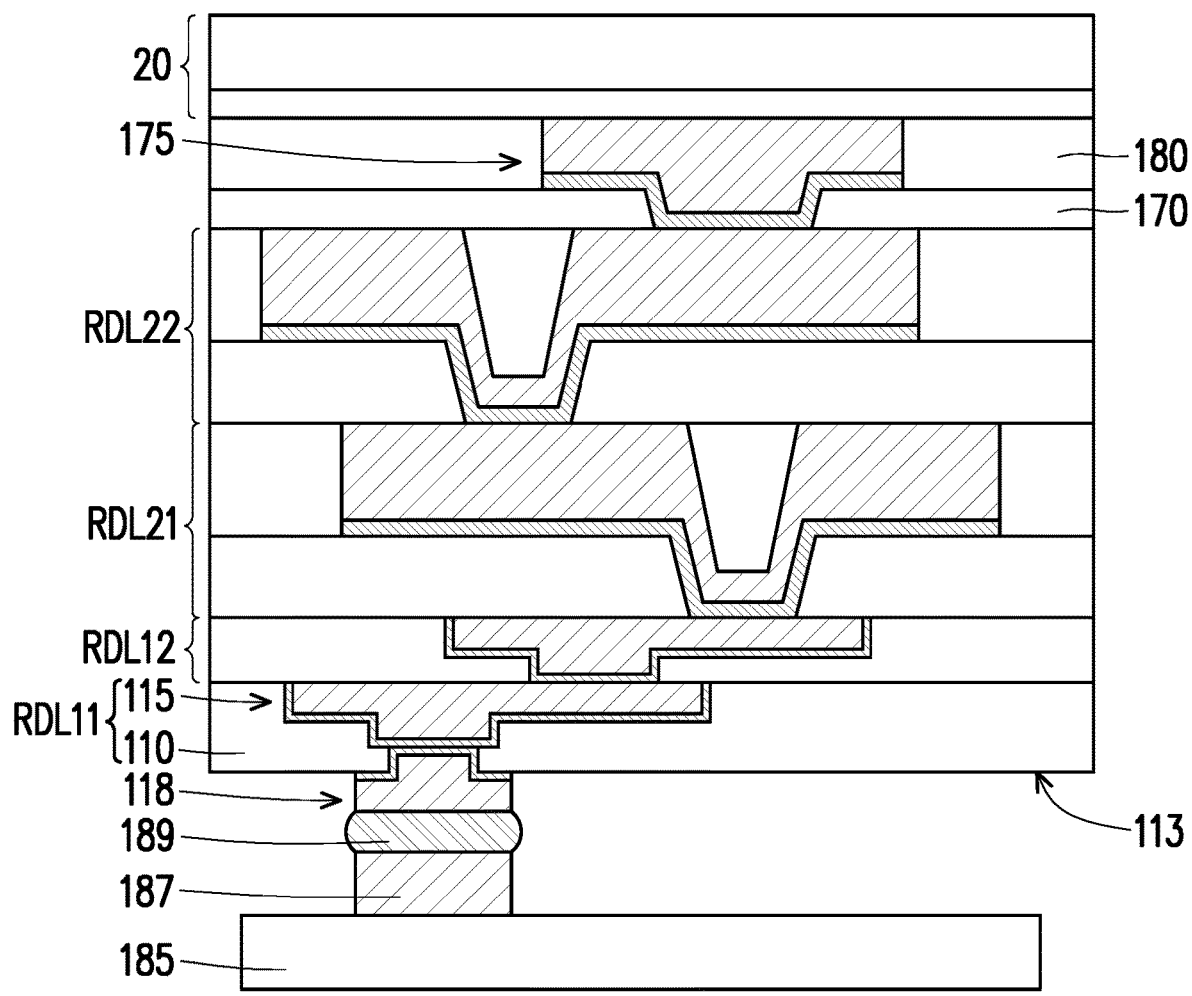
Figure 1Y:
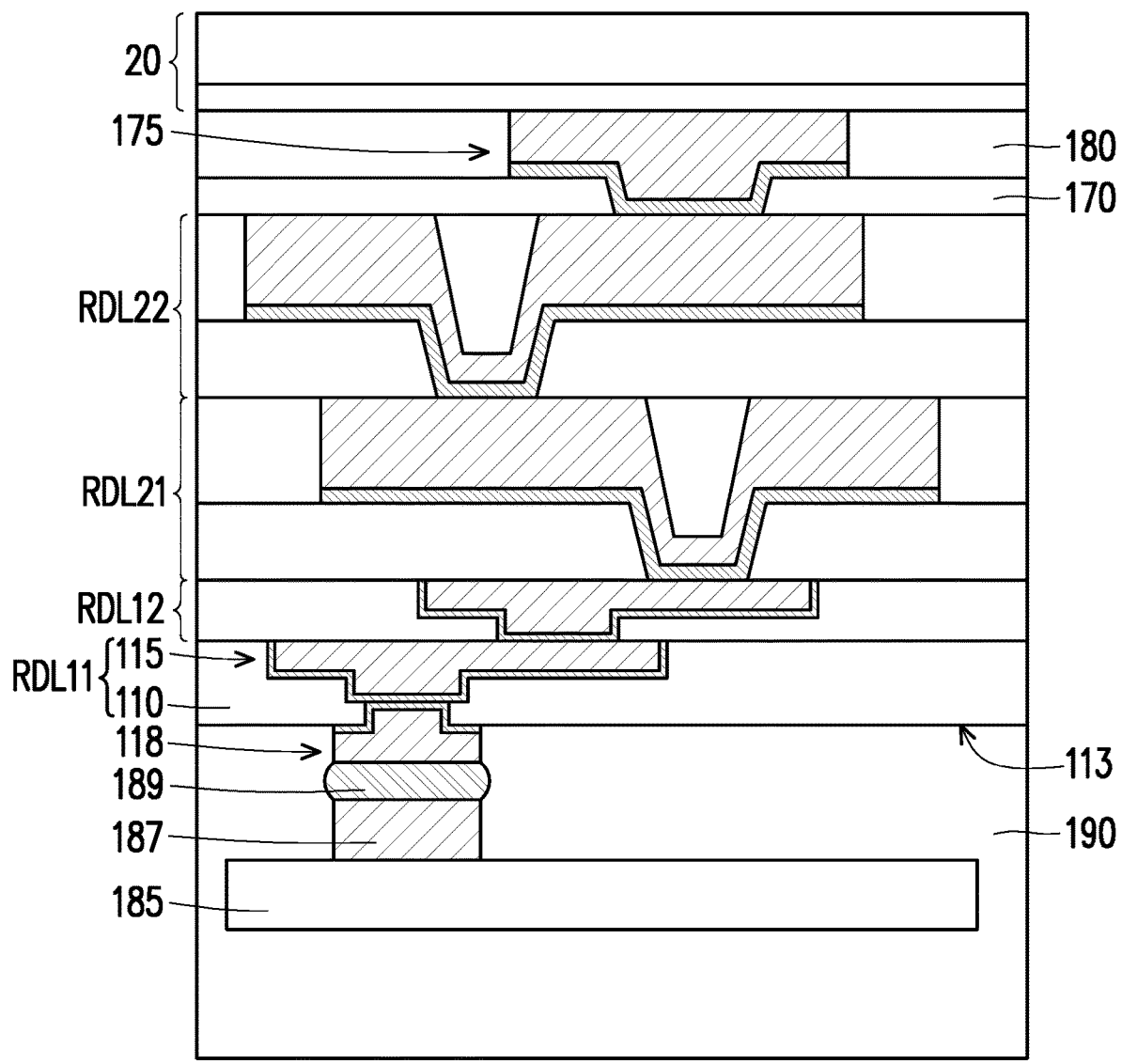
Figure 1Z:
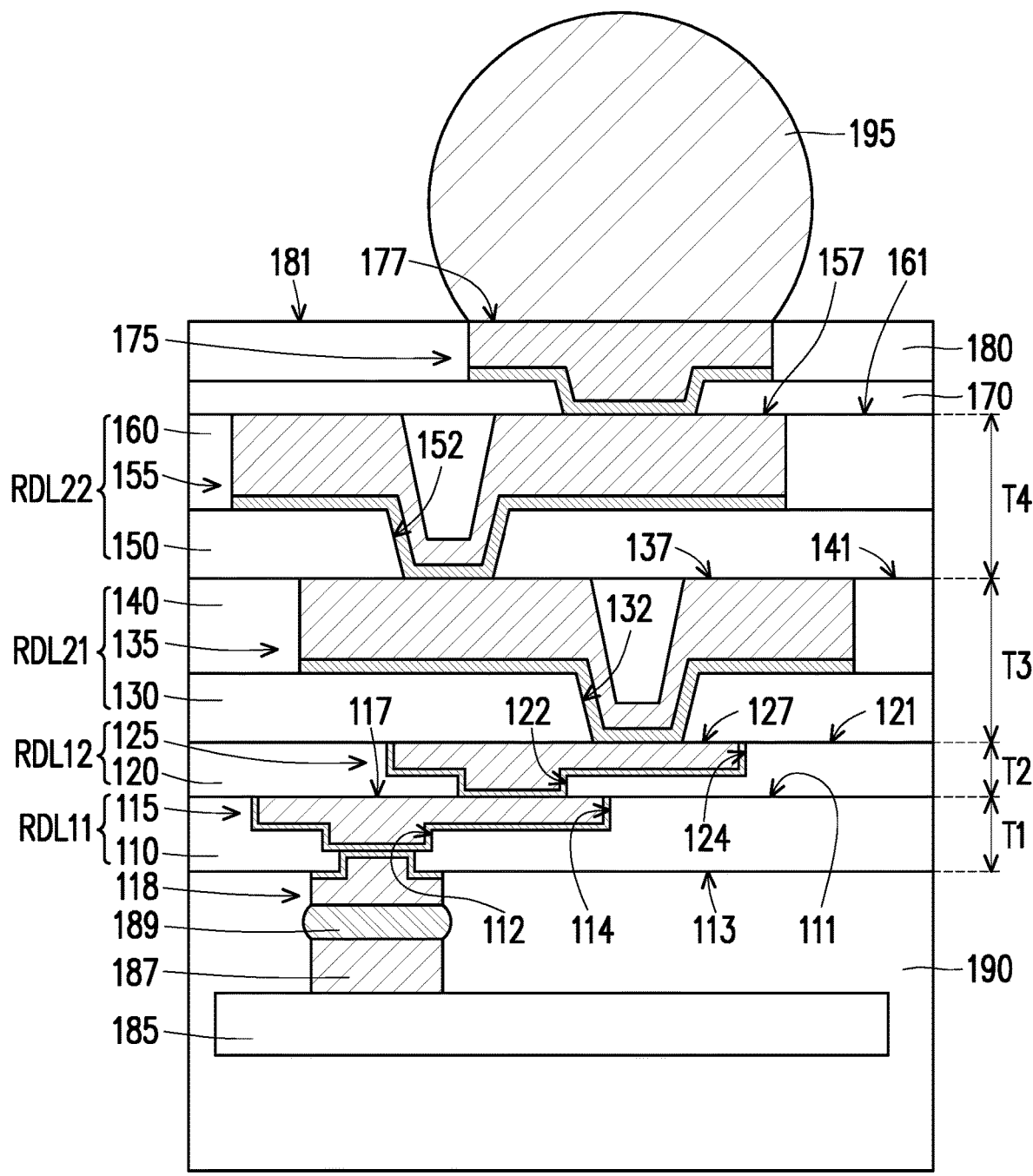

FIG. 1A to FIG. 1Z are schematic cross-sectional views of a manufacturing method of a package structure according to an embodiment of the disclosure. Regarding the manufacturing method of the package structure in this embodiment, with reference to FIG. 1A first, a first carrier 10 is provided, and the first carrier 10 includes a substrate 12 and a sacrificial layer 14 disposed on the substrate 12. Here, the substrate 12 is, for example, a temporary glass wafer or panel without a circuit, and the sacrificial layer 14 is, for example, a material suitable for laser debonding or thermal debonding.

Next, with reference to FIG. 1B, a first dielectric layer 110 is formed on the sacrificial layer 14 of the first carrier 10 through a plasma-enhanced chemical vapor deposition (PECVD) process. Here, a material of the first dielectric layer 110 is, for example, silicon dioxide, and a thickness of the first dielectric layer 110 is, for example, 1 micron.

Next, with reference to FIG. 1C, a photoresist layer P1 is formed on the first dielectric layer 110, and the photoresist layer P1 completely covers a first upper surface 111 of the first dielectric layer 110.

Next, with reference to FIG. 1D, a first photolithography process is performed on the photoresist layer P1 to form an opening O11. The opening O11 exposes the first upper surface 111 of the first dielectric layer 110.

Next, with reference to FIG. 1E, a first reactive ion etching (RIE) process is performed on the first dielectric layer 110 to form a first opening 112. Here, the first opening 112 does not penetrate through the first dielectric layer 110, and a pore size of the first opening 112 is equal to a pore size of the opening O11.

Next, with reference to FIG. 1F, a second photolithography process is performed on the photoresist layer P1 to form an opening O12. The opening O12 exposes the first opening 112, and a pore size of the opening O12 is greater than the pore size of the first opening 112.

In following, with reference to FIG. 1F again, a second RIE process is performed on the first dielectric layer 110 to form a second opening 114 communicating with the first opening 112. Here, the first opening 112 and the second opening 114 communicate with each other, and a pore size of the second opening 114 is greater than the pore size of the first opening 112. The first opening 112 is located between the second opening 114 and the first carrier 10, and the first opening 112 and the second opening 114 form a stepped structure.

Next, with reference to FIG. 1F and FIG. 1G together, the photoresist layer P1 is removed, and the first upper surface 111 of the first dielectric layer 110 is exposed.

Next, with reference to FIG. 1G, a seed material S1 is formed on the first upper surface 111 of the first dielectric layer 110, an inner wall of the first opening 112, and an inner wall of the second opening 114. Here, a material of the seed material S1 is, for example but not limited to, titanium copper.

Next, with reference to FIG. 1H, a metal material M1 is formed on the seed material S1, and the metal material M1 covers the seed material S1 and fills the first opening 112 and the second opening 114. Here, the metal material M1 is, for example but not limited to, copper.

Next, with reference to FIG. 1H and FIG. 1I together, a polishing process is performed on the metal material M1 and the seed material S1 to expose the first upper surface 111 of the first dielectric layer 110 and form a metal layer M11 and a seed layer S11 located in the first opening 112 and the second opening 114. Here, the metal layer M11 and the seed layer S11 define a first redistribution circuit 115. By this time, a first redistribution layer RDL11 is formed on the first carrier 10.

In detail, the first redistribution layer RDL11 in this embodiment includes the first dielectric layer 110 and the first redistribution circuit 115. The first dielectric layer 110 includes the first opening 112 and the second opening 114 communicating with each other, and the pore size of the second opening 114 is greater than the pore size of the first opening 112. The first redistribution circuit 115 fills the first opening 112 and the second opening 114, and the first upper surface 111 of the first dielectric layer 110 is aligned with a first surface 117 of the first redistribution circuit 115. Here, the first redistribution circuit 115 is formed through a copper Damascene process and the polishing process, the first redistribution circuit 115 is a stepped structure, and the first redistribution circuit 115 has a submicron metal line width and line spacing.

Next, with reference to FIG. 1J, steps in FIG. 1B to FIG. 1I may be selectively repeated to form a first redistribution layer RDL12 on the first redistribution layer RDL11. Here, the first redistribution layer RDL12 includes a first dielectric layer 120 and a first redistribution circuit 125. A material of the first dielectric layer 120 is, for example, silicon dioxide, the first redistribution circuit 125 has a submicron metal line width and line spacing, and the first redistribution circuit 125 is electrically connected to the first redistribution circuit 115.

Next, with reference to 1K, a second dielectric layer 130 is formed on the first redistribution layer RDL12 by coating. The second dielectric layer 130 covers a first upper surface 121 of the first dielectric layer 120 and includes a third opening 132 which exposes part of a first surface 127 of the first redistribution circuit 125. Here, a material of the second dielectric layer 130 is, for example, a photosensitive dielectric material, and a thickness of the second dielectric layer 130 is, for example, 5 microns.

Next, with reference to FIG. 1L, a seed material S2 is formed on the second dielectric layer 130 and an inner wall of the third opening 132, and the seed material S2 directly contacts the first surface 127 of the first redistribution circuit 125 exposed by the third opening 132. Here, the seed material S2 is formed through, for example, a physical vapor deposition (PVD) method.

Next, with reference to FIG. 1M, a patterned photoresist layer P2 is formed on the seed material S2, and the patterned photoresist layer P2 exposes part of the seed material S2.

Next, with reference to FIG. 1N, the patterned photoresist layer P2 is treated as an electroplating mask, and a metal material M2 is deposited on the seed material S2 exposed by the patterned photoresist layer P2 through electro-chemical deposition (ECD). Here, the metal material M2 does not fully fill the third opening 132 and thus has a concave trench C1.

Next, with reference to FIG. 1N and FIG. 1O together, the patterned photoresist layer P2 and the seed material S2 thereunder are removed to form a metal layer M22 and a seed layer S22 thereunder to define a second redistribution circuit 135. Here, the second redistribution circuit 135 is manufactured through the PVD and ECD methods, and the second redistribution circuit 135 has a metal line width and line spacing greater than or equal to 1 micron and less than or equal to 10 microns.

Next, with reference to FIG. 1P, a third dielectric layer 140 is formed on the second dielectric layer 130 and covers the second redistribution circuit 135. Here, a material of the third dielectric layer 140 is, for example, a photosensitive dielectric material, and a thickness of the third dielectric layer 140 is, for example, 5 microns. By this time, a second redistribution layer RDL21 is formed on the first redistribution layer RDL12.

In detail, in this embodiment, the second redistribution layer RDL21 includes the second dielectric layer 130, the third dielectric layer 140, and the second redistribution circuit 135. The second dielectric layer 130 includes the third opening 132. The second redistribution circuit 135 is disposed on the second dielectric layer 130, extends into the third opening 132, and is electrically connected to the first redistribution circuit 125. The third dielectric layer 140 covers the second dielectric layer 130 and the second redistribution circuit 135 and fills the third opening 132 and the concave trench C1. A second upper surface 141 of the third dielectric layer 140 is aligned with a second surface 137 of the second redistribution circuit 135.

Next, with reference to FIG. 1P again, steps in FIG. 1B to FIG. 1P may be selectively repeated to form a second redistribution layer RDL22 on the second redistribution layer RDL21. Here, the second redistribution layer RDL22 includes a second dielectric layer 150, a third dielectric layer 160, and a second redistribution circuit 155. A material of the second dielectric layer 150 and a material of the third dielectric layer 160 are both, for example, a photosensitive dielectric material, the second redistribution circuit 155 has a metal line width and line spacing between greater than or equal to 1 micron and less than or equal to 10 microns. The second redistribution circuit 135 is electrically connected to the second redistribution circuit 155.

Next, with reference to FIG. 1Q, a fourth dielectric layer 170 is formed on the second redistribution layer RDL22. The fourth dielectric layer 170 covers a second upper surface 161 of the third dielectric layer 160 and includes a fourth opening 172 which exposes part of a second surface 157 of the second redistribution circuit 155.

Next, with reference to FIG. 1R, a seed material S3 is formed on the fourth dielectric layer 170 and an inner wall of the fourth opening 172. The seed material S3 directly contacts the second surface 157 of the second redistribution circuit 155 exposed by the fourth dielectric layer 170. In following, a patterned photoresist layer P3 is formed on the seed material S3, and the patterned photoresist layer P3 exposes part of the seed material S3.

Next, with reference to FIG. 1R and FIG. 1S together, the patterned photoresist layer P3 is treated as an electroplating mask, and a metal material is electroplated on the seed material S3 exposed by the patterned photoresist layer P3. In following, the patterned photoresist layer P3 and the seed material S3 thereunder are removed to form a metal layer M33 and a seed layer S33 thereunder to define a solder ball pad 175. By this time, the solder ball pad 175 is formed on the second upper surface 161 of the third dielectric layer 160, and the solder ball pad 175 is electrically connected to the second redistribution circuit 155.

Next, with reference to FIG. 1T, a protective layer 180 is formed on the fourth dielectric layer 170, and a third surface 181 of the protective layer 180 is aligned with a fourth surface 177 of the solder ball pad 175.

Next, with reference to FIG. 1T and FIG. 1U together, a second carrier 20 is provided on the solder ball pad 175, and the first carrier 10 is removed to expose a first lower surface 113 of the first dielectric layer 110 opposite to the first upper surface 111. Here, the second carrier 20 includes a substrate 22 and a sacrificial layer 24 disposed on the substrate 22. The sacrificial layer 24 directly contacts the solder ball pad 175 and the protective layer 180. Here, the substrate 22 is, for example, a temporary glass wafer or panel without a circuit, and the sacrificial layer 24 is, for example, a material suitable for laser debonding or thermal debonding.

Next, with reference to FIG. 1U again, an RIE process is performed on the first lower surface 113 of the first dielectric layer 110 to form an opening 116 which exposes part of the first redistribution circuit 115. In following, a seed material S4 is formed on the first dielectric layer 110 and an inner wall of the opening 116.

Next, with reference to FIG. 1V, a patterned photoresist layer P4 is formed on the seed material S4, and the patterned photoresist layer P4 exposes part of the seed material S4.

Next, with reference to FIG. 1V and FIG. 1W together, the patterned photoresist layer P4 is treated as an electroplating mask, and a metal material is electroplated on the seed material S4 exposed by the patterned photoresist layer P4. In following, the patterned photoresist layer P4 and the seed material S4 thereunder are removed to form a metal layer M44 and a seed layer S44 thereunder to define a chip pad 118. By this time, the chip pad 118 is formed on the first lower surface 113 of the first dielectric layer 110, and the chip pad 118 is electrically connected to the first redistribution circuit 115.

Next, with reference to FIG. 1X, a chip 185 is provided, and a copper pillar 187 is formed on the chip 185. In following, a solder material 189 is formed on the copper pillar 187, and the chip 185 is electrically connected to the chip pad 118 through the solder material 189 on the copper pillar 187.

Next, with reference to FIG. 1Y, a molding compound 190 is formed on the first lower surface 113 of the first dielectric layer 110. The molding compound 190 covers the chip 185, the copper pillar 187, the solder material 189, and the chip pad 118.

Afterwards, with reference to FIG. 1Y and FIG. 1Z together, the second carrier 20 is removed to expose the solder ball pad 175. Finally, with reference to FIG. 1Z, a solder ball 195 is formed on the solder ball pad 175 and is electrically connected to the solder ball pad 175. By this time, manufacturing of a package structure 100a is completed.

Regarding the structure, with reference to FIG. 1Z again, in this embodiment, the package structure 100a includes at least one first redistribution layer (two first redistribution layers RDL11 and RDL12 are schematically shown), at least one second redistribution layer (two second redistribution layers RDL21 and RDL22 are schematically shown), the chip pad 118, the solder ball pad 175, the chip 185, the solder ball 195, and the molding compound 190. The first redistribution layers RDL11 and RDL12 include the first dielectric layers 110 and 120 and the first redistribution circuits 115 and 125. The first dielectric layers 110 and 120 include the first openings 112 and 122 and the second openings 114 and 124 communicating with each other. The pore sizes of the second openings 114 and 124 are greater than the pore sizes of the first openings 112 and 122, and the first redistribution circuits 115 and 125 fill the first openings 112 and 122 and the second openings 114 and 124. The first upper surfaces 111 and 121 of the first dielectric layers 110 and 120 are aligned with the first surfaces 117 and 127 of the first redistribution circuits 115 and 125.

Moreover, the second redistribution layers RDL21 and RDL22 provided by this embodiment are sequentially disposed on the first redistribution layer RDL12. The second redistribution layers RDL21 and RDL22 include the second dielectric layers 130 and 150, the third dielectric layers 140 and 160, and the second redistribution circuits 135 and 155. The second dielectric layers 130 and 150 include the third openings 132 and 152. The second redistribution circuits 135 and 155 are disposed on the second dielectric layers 130 and 150 and extend into the third openings 132 and 152. The second redistribution circuit 135 is electrically connected to the first redistribution circuit 125 of the first redistribution layer RDL12. The third dielectric layers 140 and 160 cover the second dielectric layers 130 and 150 and the second redistribution circuits 135 and 155 and fill the third openings 132 and 152. The second upper surfaces 141 and 161 of the third dielectric layers 140 and 160 are aligned with the second surfaces 137 and 157 of the second redistribution circuits 135 and 155.

With reference to FIG. 1Z again, the chip pad 118 of this embodiment is disposed on the first lower surface 113 of the first dielectric layer 110 oppose to the first upper surface 111, and the chip pad 118 is electrically connected to the first redistribution circuit 115. The solder ball pad 175 is disposed on the second upper surface 161 of the third dielectric layer 160, and the solder ball pad 175 is electrically connected to the second redistribution circuit 155. The chip 185 is disposed on the chip pad 118 and is electrically connected to the chip pad 118. The solder ball 195 is disposed on the solder ball pad 175 and is electrically connected to the solder ball pad 175. The molding compound 190 is disposed on the first lower surface 113 of the first dielectric layer 110 and at least covers the chip 185 and the chip pad 118. Here, thicknesses T1 and T2 of the first redistribution layers RDL11 and RDL12 are less than thicknesses T3 and T4 of the second redistribution layers RDL21 and RDL22.

Moreover, the package structure 100a of this embodiment further includes the fourth dielectric layer 170 and the protective layer 180 thereon. The fourth dielectric layer 170 covers the second upper surface 161 of the third dielectric layer 160 and the second surface 157 of the second redistribution circuit 155. The solder ball pad 175 is located on the fourth dielectric layer 170. The protective layer 180 is disposed on the second upper surface 161 of the third dielectric layer 160, and the fourth dielectric layer 170 is located between the protective layer 180 and the third dielectric layer 160. The third surface 181 of the protective layer 180 is aligned with the fourth surface 177 of the solder ball pad 175.

In addition, the package structure 100a of this embodiment further includes the copper pillar 187 and the solder material 189. The copper pillar 187 is disposed on the chip 185, and the solder material 189 is disposed on the copper pillar 187. The chip 185 is electrically connected to the chip pad 118 through the solder material 189 on the copper pillar 187. The molding compound 190 covers the chip 185, the copper pillar 187, the solder material 189, and the chip pad 118. The chip 185 is electrically connected to the chip pad 118 through the copper pillar 187 and the solder material 189.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2:
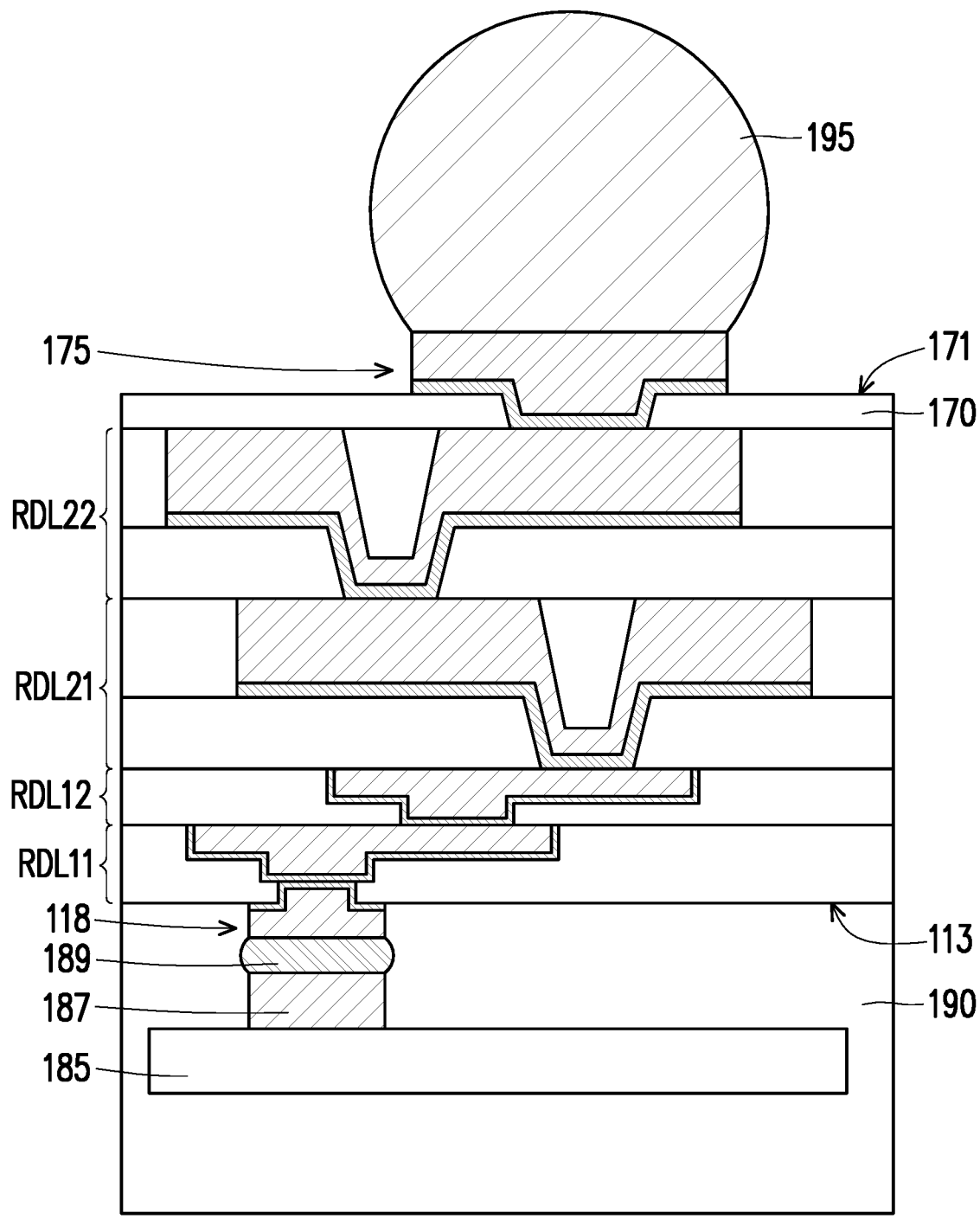
FIG. 2 is a schematic cross-sectional view of a package structure according to another embodiment of the disclosure.

FIG. 2 is a schematic cross-sectional view of a package structure according to another embodiment of the disclosure. With reference to FIG. 1Z and FIG. 2 together, a package structure 100b of this embodiment is similar to the package structure 100a. A difference therebetween is that the protective layer 180 is not disposed in this embodiment. That is, the solder ball pad 175 is a structure protruding from the surface 171 of the fourth dielectric layer 170.

In view of the foregoing, in the package structure and the manufacturing method thereof provided by the disclosure, the first redistribution layer and the second redistribution layer of completely different structure types are formed. The first redistribution circuit of the first redistribution layer is formed through the copper Damascene process and the polishing process, and the first dielectric layer is made of silicon dioxide. The second redistribution circuit of the second redistribution layer is manufactured through the PVD and ECD methods, and the second dielectric layer and the third dielectric layer are made of photosensitive dielectric materials. In this way, the metal line width and line spacing of the first redistribution circuit of the first redistribution layer may be submicron, and the metal line width and line spacing of the second redistribution circuit of the second redistribution layer may be greater than or equal to 1 micron and less than or equal to 10 microns. Compared with the manufacturing of existing build-up package substrates, the package structure of the disclosure may form two redistribution layers of different structure types, and in this way, people's expectations and requirements for high-density package structures are satisfied.

Although the disclosure has been disclosed in the above embodiments, the embodiments are not intended to limit the disclosure. Persons skilled in the art may make some changes and modifications without departing from the spirit and the scope of the disclosure. Accordingly, the protection scope of the disclosure shall be defined by the appended claims.

What is claimed is:
1. A package structure, comprising:
at least one first redistribution layer, comprising a first dielectric layer and a first redistribution circuit, wherein the first dielectric layer comprises a first opening and a second opening communicating with each other, a pore size of the second opening is greater than a pore size of the first opening, the first redistribution circuit fills the first opening and the second opening, and a first upper surface of the first dielectric layer is aligned with a first surface of the first redistribution circuit;
at least one second redistribution layer, disposed on the at least one first redistribution layer, wherein the at least one second redistribution layer comprises a second dielectric layer, a third dielectric layer, and a second redistribution circuit, the second dielectric layer comprises a third opening, the second redistribution circuit is disposed on the second dielectric layer, extends into the third opening, and is electrically connected to the at least one first redistribution layer, the third dielectric layer covers the second dielectric layer and the second redistribution circuit and fills the third opening, and a second upper surface of the third dielectric layer is aligned with a second surface of the second redistribution circuit;
a chip pad, disposed on a first lower surface of the first dielectric layer opposite to the first upper surface, electrically connected to the first redistribution circuit;

a solder ball pad, disposed on the second upper surface of the third dielectric layer, electrically connected to the second redistribution circuit;

a chip, disposed on the chip pad, electrically connected to the chip pad;

a solder ball, disposed on the solder ball pad, electrically connected to the solder ball pad; and a molding compound, disposed on the first lower surface of the first dielectric layer, at least covering the chip and the chip pad.

2. The package structure according to claim 1, wherein a material of the first dielectric layer comprises silicon dioxide.

3. The package structure according to claim 1, wherein a material of the second dielectric layer comprises a photosensitive dielectric material.

4. The package structure according to claim 1, wherein the first redistribution circuit has a submicron metal line width and line spacing.

5. The package structure according to claim 1, wherein the second redistribution circuit has a metal line width and line spacing greater than or equal to 1 micron and less than or equal to 10 microns.

6. The package structure according to claim 1, wherein each of the first redistribution circuit and the second redistribution circuit comprises a seed layer and a metal layer disposed on the seed layer.

7. The package structure according to claim 1, wherein each of the chip pad and solder ball pad comprises a seed layer and a metal layer disposed on the seed layer.

8. The package structure according to claim 1, wherein a thickness of the at least one first redistribution layer is less than a thickness of the at least one second redistribution layer.

9. The package structure according to claim 1, further comprising:

a protective layer, disposed on the second upper surface of the third dielectric layer, wherein a third surface of the protective layer is aligned with a fourth surface of the solder ball pad.

10. The package structure according to claim 1, further comprising:

a copper pillar, disposed on the chip; and a solder material, disposed on the copper pillar, wherein the chip is electrically connected to the chip pad through the copper pillar and the solder material.

11. A manufacturing method of a package structure, comprising:

forming at least one first redistribution layer on a first carrier, wherein the at least one first redistribution layer comprises a first dielectric layer and a first redistribution circuit, the first dielectric layer comprises a first opening and a second opening communicating with each other, a pore size of the second opening is greater than a pore size of the first opening, the first redistribution circuit fills the first opening and the second opening, and a first upper surface of the first dielectric layer is aligned with a first surface of the first redistribution circuit;

forming at least one second redistribution layer on the at least one first redistribution layer, wherein the at least one second redistribution layer comprises a second dielectric layer, a third dielectric layer, and a second redistribution circuit, the second dielectric layer comprises a third opening, the second redistribution circuit is disposed on the second dielectric layer, extends into the third opening, and is electrically connected to the at least one first redistribution layer, the third dielectric layer covers the second dielectric layer and the second redistribution circuit and fills the third opening, and a second upper surface of the third dielectric layer is aligned with a second surface of the second redistribution circuit;

forming a solder ball pad on the second upper surface of the third dielectric layer, wherein the solder ball pad is electrically connected to the second redistribution circuit;

providing a second carrier on the solder ball pad and removing the first carrier to expose a first lower surface of the first dielectric layer opposite to the first upper surface;

foil ling a chip pad on the first lower surface of the first dielectric layer, wherein the chip pad is electrically connected to the first redistribution circuit;

arranging a chip on the chip pad, wherein the chip is electrically connected to the chip pad;

forming a molding compound on the first lower surface of the first dielectric layer, wherein the molding compound at least covers the chip and the chip pad;

removing the second carrier to expose the solder ball pad; and forming a solder ball on the solder ball pad, wherein the solder ball is electrically connected to the solder ball pad.

12. The manufacturing method of the package structure according to claim 11, wherein the step of forming the at least one first redistribution layer on the first carrier comprises:

forming the first dielectric layer on the first carrier through a plasma-enhanced chemical vapor deposition process;

performing a reactive ion etching process on the first dielectric layer to form the first opening and the second opening communicating with each other;

forming a seed material on the first upper surface of the first dielectric layer, an inner wall of the first opening, and an inner wall of the second opening;

performing a metal material on the seed material, wherein the metal material covers the seed material and fills the first opening and the second opening; and performing a polishing process on the metal material and the seed material to expose the first upper surface of the first dielectric layer and form a metal layer and a seed layer located in the first opening and the second opening, wherein the metal layer and the seed layer define the first redistribution circuit.

13. The manufacturing method of the package structure according to claim 11, wherein the step of forming the at least one second redistribution layer on the at least one first redistribution layer comprises:

forming the second dielectric layer on the at least one first redistribution layer, wherein the second dielectric layer covers the first upper surface of the first dielectric layer and comprises the third opening exposing part of the first surface of the first redistribution circuit;

forming a seed material on the second dielectric layer and an inner wall of the third opening;

forming a patterned photoresist layer on the seed material, wherein the patterned photoresist layer exposes part of the seed material;

treating the patterned photoresist layer as an electroplating mask to electro-chemically deposit a metal material on the seed material exposed by the patterned photoresist layer;

removing the patterned photoresist layer and the seed material thereunder to form a metal layer and a seed layer thereunder to define the second redistribution circuit; and forming the third dielectric layer on the second dielectric layer, wherein the third dielectric layer covers the second redistribution circuit.

14. The manufacturing method of the package structure according to claim 11, wherein the step of forming the solder ball pad on the second upper surface of the third dielectric layer comprises:

forming a fourth dielectric layer on the at least one second redistribution layer, wherein the fourth dielectric layer covers the second upper surface of the third dielectric layer and comprises the fourth opening exposing part of the second surface of the second redistribution circuit;

forming a seed material on the fourth dielectric layer and an inner wall of the fourth opening;

forming a patterned photoresist layer on the seed material, wherein the patterned photoresist layer exposes part of the seed material;

treating the patterned photoresist layer as an electroplating mask to electroplate a metal material on the seed material exposed by the patterned photoresist layer; and removing the patterned photoresist layer and the seed material thereunder to form a metal layer and a seed layer thereunder to define the solder ball pad.

15. The manufacturing method of the package structure according to claim 14, further comprising:

forming a protective layer on the fourth dielectric layer, wherein a third surface of the protective layer is aligned with a fourth surface of the solder ball pad.

16. The manufacturing method of the package structure according to claim 11, wherein the step of forming the chip pad on the first lower surface of the first dielectric layer comprises:

performing a reactive ion etching process to the first dielectric layer to form an opening exposing part of the first redistribution circuit;

forming a seed material on the first dielectric layer and an inner wall of the opening;

forming a patterned photoresist layer on the seed material, wherein the patterned photoresist layer exposes part of the seed material;

treating the patterned photoresist layer as an electroplating mask to electroplate a metal material on the seed material exposed by the patterned photoresist layer; and removing the patterned photoresist layer and the seed material thereunder to form a metal layer and a seed layer thereunder to define the chip pad.

17. The manufacturing method of the package structure according to claim 11, wherein the step before arranging the chip on the chip pad further comprises:

forming a copper pillar on the chip; and forming a solder material on the copper pillar, wherein the chip is electrically connected to the chip pad through the solder material on the copper pillar.

18. The manufacturing method of the package structure according to claim 11, wherein a material of the first dielectric layer comprises silicon dioxide, and a material of the second dielectric layer comprises a photosensitive dielectric material.

19. The manufacturing method of the package structure according to claim 11, wherein the first redistribution circuit has a submicron metal line width and line spacing.

20. The manufacturing method of the package structure according to claim 11, wherein the second redistribution circuit has a metal line width and line spacing greater than or equal to 1 micron and less than or equal to 10 microns.

* * * * *